(12) United States Patent
Lyakh et al.

(10) Patent No.: US 12,034,276 B2
(45) Date of Patent: *Jul. 9, 2024

(54) QUANTUM CASCADE LASER WITH HIGH EFFICIENCY OPERATION AND RELATED SYSTEMS AND METHODS

(71) Applicant: UNIVERSITY OF CENTRAL FLORIDA RESEARCH FOUNDATION, INC., Orlando, FL (US)

(72) Inventors: Arkadiy Lyakh, Oviedo, FL (US); Matthew Suttinger, Orlando, FL (US)

(73) Assignee: UNIVERSITY OF CENTRAL FLORIDA RESEARCH FOUNDATION, INC., Orlando, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 17/938,817

(22) Filed: Oct. 7, 2022

(65) Prior Publication Data

US 2023/0163571 A1 May 25, 2023

Related U.S. Application Data

(62) Division of application No. 17/002,129, filed on Aug. 25, 2020, now Pat. No. 11,502,482, which is a
(Continued)

(51) Int. Cl.
*H01S 5/34* (2006.01)
*H01S 5/026* (2006.01)
(Continued)

(52) U.S. Cl.
CPC .......... *H01S 5/3402* (2013.01); *H01S 5/026* (2013.01); *H01S 5/20* (2013.01); *H01S 5/22* (2013.01)

(58) Field of Classification Search
CPC .......... H01S 5/3402; H01S 5/026; H01S 5/20; H01S 5/22
See application file for complete search history.

(56) References Cited

U.S. PATENT DOCUMENTS 5,263,037 A * 11/1993 Trutna, Jr. ............. H01S 3/083
372/13
8,014,430 B2 9/2011 Patel et al.
(Continued)

OTHER PUBLICATIONS

A. Lyakh et al., "High-Performance continuous-wave room temperature 4.0-um quantum cascade lasers with single-facet optical emission exceeding 2 W", Proc Natl Acad Sci USA. Nov. 2, 2010; 107(44): 18799-18802 (Year: 2010).*
(Continued)

*Primary Examiner* — Xinning(Tom) Niu
(74) *Attorney, Agent, or Firm* — Allen, Dyer, Doppelt + Gilchrist, PA (57) ABSTRACT

A QCL may include a substrate, and a sequence of semiconductor epitaxial layers adjacent the substrate and defining an active region, an injector region adjacent the active region, and a waveguide optically coupled to the active region. The active region may include stages, each stage having an upper laser level and a lower laser level defining respective first and second wave functions. The upper laser level may have an upper laser level average coordinate, and the lower laser level may have a lower laser level average coordinate. The upper laser level average coordinate and the lower laser level average coordinate may have spacing of less than 10 nm. Wave functions for all active region energy levels located below the lower laser level may have greater than 10% overlap with the injector region.

18 Claims, 9 Drawing Sheets

Related U.S. Application Data division of application No. 16/136,713, filed on Sep. 20, 2018, now Pat. No. 10,811,847.

(60) Provisional application No. 62/608,761, filed on Dec. 21, 2017.

(51) Int. Cl.
*H01S 5/20* (2006.01)
*H01S 5/22* (2006.01)

(56) References Cited

U.S. PATENT DOCUMENTS

| | | | |
|---|---|---|---|
| 8,068,524 B1 | 11/2011 | Patel et al. | |
| 8,121,164 B1* | 2/2012 | Lyakh | H01S 5/3402 |
| | | | 372/45.01 |
| 9,077,153 B2 | 7/2015 | Maulini et al. | |
| 9,608,408 B2 | 3/2017 | Lyakh et al. | |
| 9,917,418 B2 | 3/2018 | Razeghi | |
| 10,020,635 B1 | 7/2018 | Lyakh | |
| 10,177,535 B1 | 1/2019 | Lyakh | |
| 2003/0042476 A1* | 3/2003 | Nakahara | H01S 5/04256 |
| | | | 257/10 |
| 2009/0213890 A1 | 8/2009 | Patel et al. | |
| 2013/0010823 A1 | 1/2013 | Maulini et al. | |
| 2013/0121359 A1 | 5/2013 | Mansour et al. | |
| 2014/0233596 A1* | 8/2014 | Fang | H01S 5/2202 |
| | | | 372/45.012 |
| 2015/0103857 A1 | 4/2015 | Maulini et al. | |
| 2015/0184994 A1* | 7/2015 | Flanders | H01S 5/141 |
| | | | 372/20 |
| 2015/0333472 A1* | 11/2015 | Demir | H01S 3/10061 |
| | | | 372/27 |
| 2016/0322788 A1 | 11/2016 | Lyakh et al. | |
| 2018/0048118 A1 | 2/2018 | Lyakh | |
| 2018/0254603 A1 | 9/2018 | Patel et al. | |

OTHER PUBLICATIONS

Lyakh et al. "High-Performance continuous-wave room temperature 4.0-1.Jm quantum cascade lasers with single-facet optical emission exceeding 2 W", Proc Natl Acad Sci US A. Nov. 2, 2010; 107(44): 18799-18802 (Year: 2010) See U.S. Appl. No. 17/002,129.

Dhirhe et al. "Quantum cascade lasers with an integrated polarization mode converter" Optics Express; Nov. 5, 2012 / vol. 20, No. 23 / 25711; pp. 7 See U.S. Appl. No. 17/002,129.

* cited by examiner

QUANTUM CASCADE LASER WITH HIGH EFFICIENCY OPERATION AND RELATED SYSTEMS AND METHODS

RELATED APPLICATIONS

This application is a divisional of U.S. application Ser. No. 17/002,129 filed Aug. 25, 2020, which is a divisional of U.S. application Ser. No. 16/136,713 filed Sep. 20, 2018, now U.S. Pat. No. 10,811,847, which is based upon prior filed Application No. 62/608,761 filed Dec. 21, 2017, which are hereby incorporated herein in their entireties by reference.

GOVERNMENT RIGHTS

This invention was made with government support under award No. N00014-16-1-2424, which was awarded by the Office of Naval Research's funding. The government has certain rights in the invention.

TECHNICAL FIELD

The present disclosure relates to lasers and, in particular, to quantum cascade laser and related methods.

BACKGROUND

Quantum cascade lasers (QCLs) differ from traditional semiconductor diode lasers in that they do not use a p-n junction for light emission. Multiple active regions are "cascaded" so that each injected electron can emit multiple photons and therefore enhance laser gain. Each active region includes a multi-layered semiconductor material structure. This multi-layered semiconductor material structure is designed to have an electronic band structure that gives the desired emission wavelength, and is manufactured with nanometer-level thickness control.

Most commercially available QCLs are of the "edge-emitting" variety. In these approaches, linear ridges are created by etching vertically through the layered structure, which has been grown on a wafer substrate. These are cleaved so that the active region comprises a rectangular ridge several millimeters in length, which forms a waveguide. The laser radiation is amplified by passing back and forth along the axis of the ridge. Laser emission occurs on the end facets of these ridges.

Figure 1A:
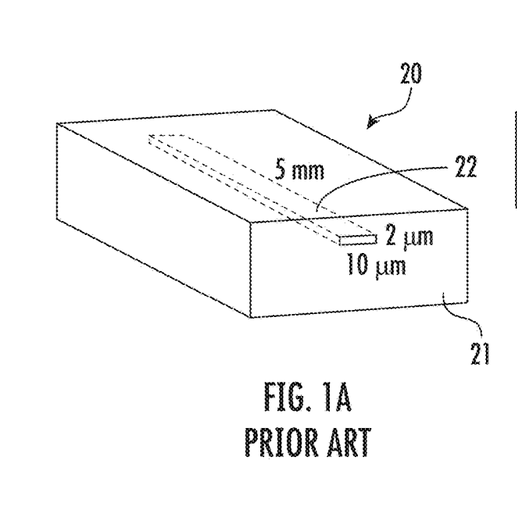
FIG. 1A is a schematic diagram of a prior art narrow-ridge configuration with typical ridge width of less than 10 μm.

In FIG. 1A, a typical QCL device 20 is shown. The QCL device 20 includes a substrate 21, and an active region 22 formed thereon. Here, the active region 22 comprises a narrow configuration, and has a ridge width of 10 µm, a height of 2 µm, and a length of 5 mm.

SUMMARY

Generally, a QCL may comprise a substrate, and a sequence of semiconductor epitaxial layers adjacent the substrate and defining an active region, an injector region adjacent the active region, and a waveguide optically coupled to the active region. The active region may include a plurality of stages. Each stage may have an upper laser level and a lower laser level defining respective first and second wave functions. The upper laser level may have an upper laser level average coordinate, and the lower laser level may have a lower laser level average coordinate. The upper laser level average coordinate and the lower laser level average coordinate may have spacing therebetween of less than 10 nm. Wave functions for all active region energy levels located below the lower laser level may have greater than 10% overlap with the injector region. Energy spacing between uppermost laser levels may exceed 60 meV. A depth of the active region may be greater than 100 meV.

Additionally, the upper laser level average coordinate and the lower laser level average coordinate may be derived based upon $\int x\, \psi^2 dx$. The active region may have a width exceeding 15 µm.

In some embodiments, the waveguide and the active region may define a double-channel shallow-ridge configuration with channel width exceeding 50 µm and a ridge width exceeding 15 µm. In other embodiments, the waveguide and the active region may define a two-level ridge configuration, and a first level ridge may extend into the active region. Also, a second level ridge may extend to a depth less than that of the first level ridge. Moreover, some embodiments may have the waveguide and the active region defining a multi-channel configuration with greater than 2 channels.

Moreover, the QCL may include an insulator layer over the sequence of semiconductor epitaxial layers, and an electrically conductive layer over the insulator layer. The waveguide may define first and second opposing facets, each facet configured to emit a laser output.

Another aspect is directed to a QCL system. The QCL system may include a QCL comprising a substrate, and a sequence of semiconductor epitaxial layers adjacent the substrate and defining an active region, an injector region adjacent the active region, and a waveguide optically coupled to the active region. The waveguide may define first and second opposing facets configured to respectively emit first and second laser outputs. The active region may include a plurality of stages. Each stage may have an upper laser level and a lower laser level defining respective first and second wave functions. The upper laser level may have an upper laser level average coordinate, and the lower laser level may have a lower laser level average coordinate. The upper laser level average coordinate and the lower laser level average coordinate may have spacing therebetween of less than 10 nm. Wave functions for all active region energy levels located below the lower laser level may have greater than 10% overlap with the injector region. Energy spacing between uppermost laser levels may exceed 60 meV. A depth of the active region may be greater than 100 meV. The QCL system may further comprise a plurality of mirrors, and a half-wave plate configured to combine the first and second laser outputs.

Yet another aspect is directed to a method of making a QCL. The method may include forming a sequence of semiconductor epitaxial layers adjacent a substrate and defining an active region, an injector region adjacent the active region, and a waveguide optically coupled to the active region. The active region may include a plurality of stages, each stage having an upper laser level and a lower laser level defining respective first and second wave functions. The upper laser level may have an upper laser level average coordinate, and the lower laser level may have a lower laser level average coordinate. The upper laser level average coordinate and the lower laser level average coordinate may have spacing therebetween of less than 10 nm. Wave functions for all active region energy levels located below the lower laser level may have greater than 10% overlap with the injector region. Energy spacing between uppermost laser levels may exceed 60 meV. A depth of the active region may be greater than 100 meV.

DETAILED DESCRIPTION

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

INTRODUCTION

The 10 W continuous wave (CW) optical power level is presently considered to be potentially difficult with single QCL emitters, which undermines QCLs positioning as a technology of the future in some applications (where high power is needed in a small package). The present disclosure describes a design for a compact laser module projected to deliver over 30 W of optical power into a high brightness Midwave Infrared (MWIR) beam. The unprecedented combination of size, weight, and power for the module may be helpful in these applications and other high power MWIR laser applications.

Broad-Area Configuration

Optical power from traditional narrow-ridge QCLs will likely stay close to 5 W [1, 2] (which results into 3.5 W to 4.0 W on system level) due to two main reasons: limited wall plug efficiency and optical damage of the front facet. CW MWIR QCL efficiency has been clamped at approximately 20% for the last five years and device modeling results indicate that there is not much room for further improvement. At the same time, even if higher efficiency devices were available, it would be very difficult to substantially increase power level as QCLs tend to fail at optical power densities of 10 MW/cm², which roughly corresponds to total power level of 5 W for narrow (10 μm-wide) devices.

Increase in power level from single QCL emitters, therefore, reduces to (a) increase in laser core dimensions (power scaling) and (b) increase in the emission aperture size (lower optical power density at the output facet).

Figure 1B:
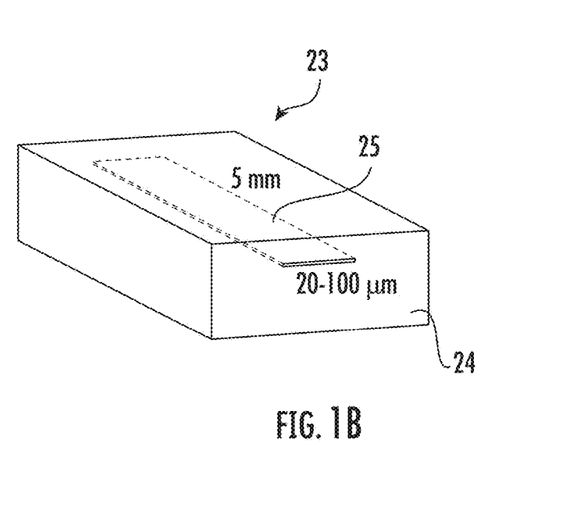
FIG. 1B is a schematic diagram of a broad-area configuration with ridge width of greater than 15 μm and reduced laser core thickness, according to the present disclosure.

The broad-area configuration QCL 23 (substrate 24, FIG. 1B) had never been actively pursued to increase CW or average optical power of QCLs before 2016 due to a firm belief that laser core self-heating would prevent CW lasing. The QCL self-heating effect is largely caused by a low thermal conductivity of the laser core 25 in the epitaxial growth direction. To reduce temperature, a traditional approach is to employ narrow ridge devices (7-10 μm), utilize semi-insulating InP lateral overgrowth, and mount the devices epi-side down.

Laser core thermal resistance can be drastically reduced and laser self-heating can be suppressed by reducing laser core thickness. Device modeling results demonstrate that this will lead to a lower temperature for the same total electrical power dissipated in the thinner core, or, which is of primary interest here, to the same average temperature for much wider devices [3,4]. This makes power scaling with lateral device dimensions possible. In the following, a laser design and laser packaging tailored to the broad-area configuration is disclosed. The design ideas presented here can also be used for optimizing performance of traditional (narrow ridge) QCLs (See FIG. 1A).

Laser Core Design

CW broad-area QCL performance depends on laser thermal resistance as well as on its pulsed laser characteristics, such as injection efficiency for the upper laser level, $\eta_i$, differential modal gain, $\Gamma g$, waveguide losses, $\alpha_w$, and transparency current, $J_{tr}$. The present disclosure provides analysis of several QCL designs in the broad-area configuration and observed a general trend: structures that have a low transparency current tend to outperform structures with a higher transparency current even when pulsed laser efficiency is the same in both cases. This is illustrated below.

Figure 2:
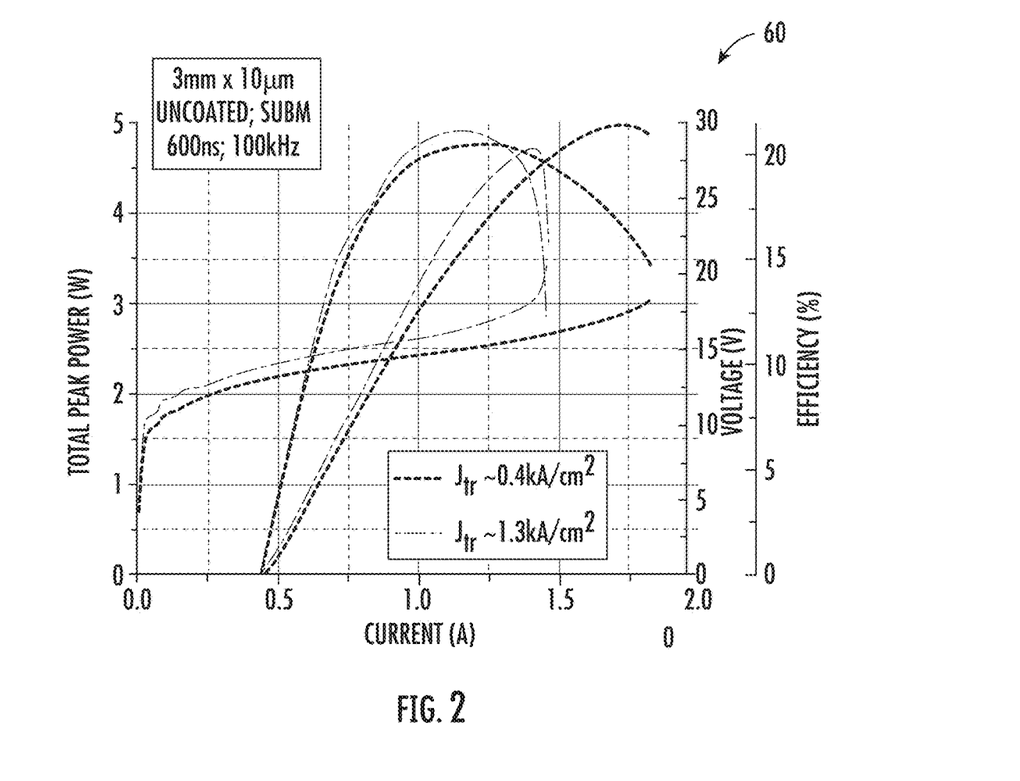
FIG. 2 is a diagram of experimental pulsed optical power versus current and voltage versus current characteristics for two exemplary structures with $J_{tr}$=0.4 kA/cm² and $J_{tr}$=1.3 kA/cm², according to the present disclosure.

FIG. 2 shows a diagram 60 of experimental pulsed optical power versus current and voltage versus current characteristics for two exemplary structures with essentially identical measured maximum efficiency ($J_{tr}$=0.4 kA/cm² (cross-hatched) and $J_{tr}$=1.3 kA/cm² (normal line)). However, the basic parameters characterizing their performance ($\eta_i$, $\Gamma g$, $\alpha_w$, and $J_{tr}$) were different. Specifically, ratio of $J_{tr}$ for the two structure exceeded factor of three. The structure with $J_{tr}$=0.4 kA/cm² had a lower $\eta_i$ (57% versus 72%), which explains why the two structures had similar overall pulsed efficiency.

Measured $\eta_i$, $\Gamma g$, $\alpha_w$, and $J_{tr}$ for the two structures were used for CW optical power projections in the broad-area configuration (ridge width>10 μm) using the model developed and validated in Ref. 4. It was determined that the structure with $J_{tr}$=0.4 kA/cm² had a much more efficient power scaling with increase in ridge width, i.e. a higher projected total CW optical power. Qualitatively, the root cause of the different projected behavior is the following. In addition to increase in ridge width, power scaling assumes employment of long cavity HR-coated devices that have low mirror losses, $\alpha_m$. A combination of a low $J_{tr}$ and low mirror losses results into a low threshold current density $J_{th}$ as the latter is defined by ($\Gamma g$ and $\alpha_w$ were approximately the same for the two designs):

$$J_{th} = J_{tr} + \frac{\alpha_m + \alpha_w}{\Gamma g}$$

The low $J_{th}$, in turn, leads to a lower laser core temperature at threshold and, therefore, a higher slope efficiency in CW mode. As a consequence, one of the goals in broad-area QCL design should be a reduction in transparency current density.

Figure 3A:
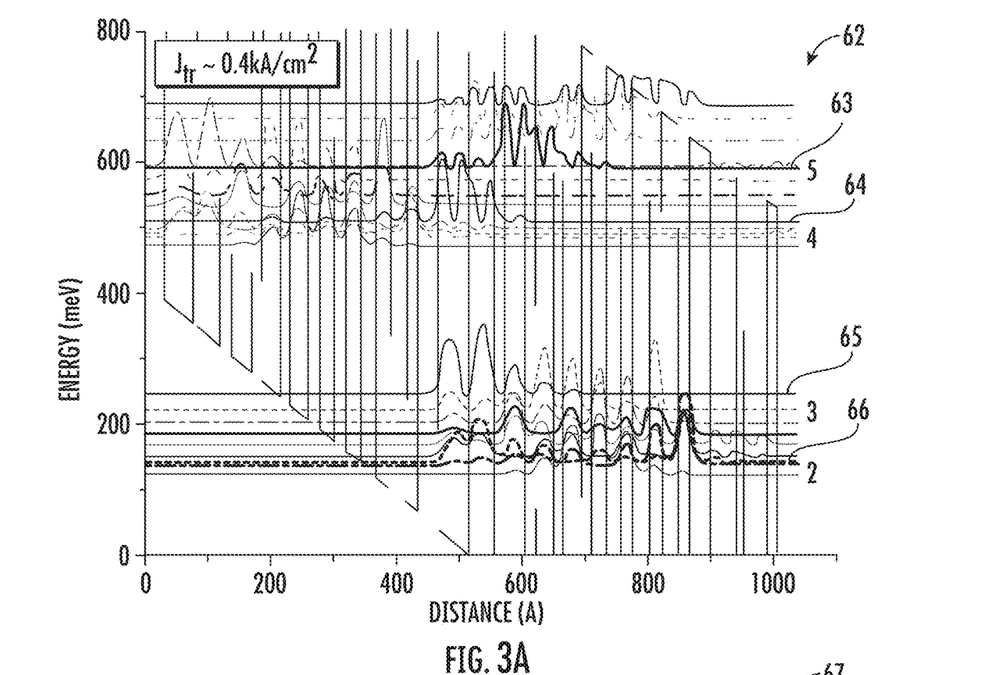
FIGS. 3A and 3B are band diagrams of the structure with $J_{tr}$=0.4 kA/cm² and $J_{tr}$=1.3 kA/cm², respectively, according to the present disclosure.
Figure 3B:
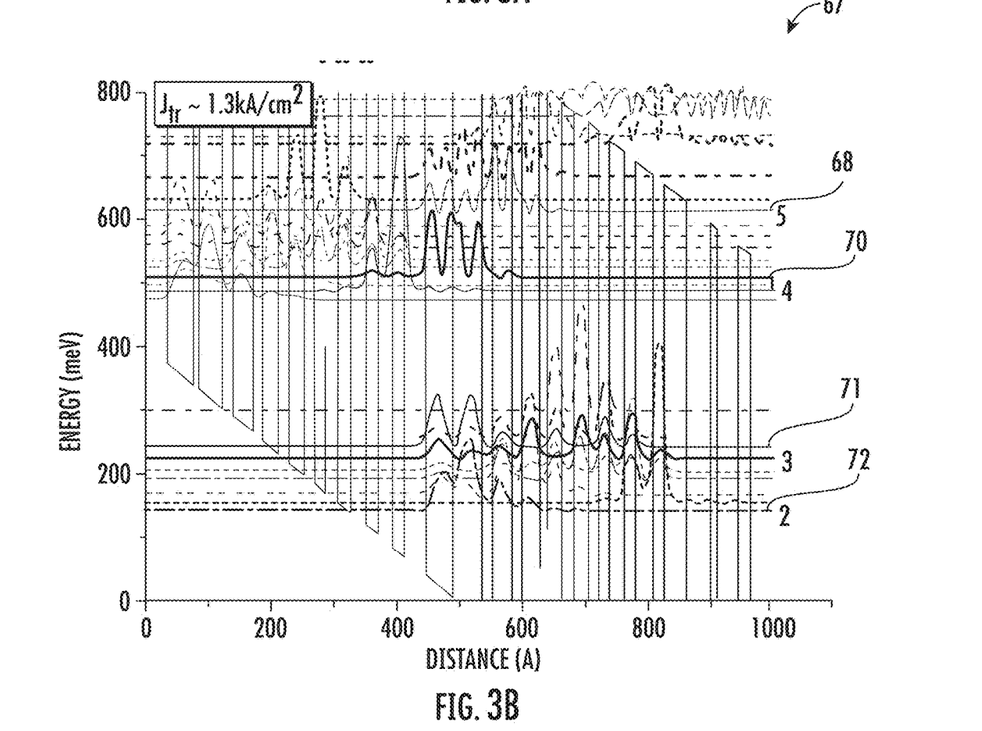

Transparency current density is a function of carrier backscattering to the lower laser level 3 and injection efficiency into the upper laser level 4, both very difficult to predict from first principles. FIGS. 3A-3B compares band-diagrams for the two structure. The increased carrier backscattering for the structure with $J_{tr}$=1.3 kA/cm² can be explained with carrier build up on the active region level 2 located below the lower laser level 3. The active region is defined here as a sequence of layers where the upper laser level 4 and lower laser level 3 are mostly localized. The buildup is caused by a low active region/injector coupling (tight level 2 confinement within the active region). Injector is defined here as the remaining sequence of layers in the laser core. For the structure with $J_{tr}$=0.4 kA/cm², on the other hand, carriers more easily escape from level 2 into the injector due to a larger active region/injector coupling, preventing carrier build up on level 2 and, therefore, reducing carrier backscattering to level 3. The band diagram analysis presented above suggests that the backscattering problem can be further suppressed by further increasing active region/injector coupling.

However, the active region/injector coupling cannot be made arbitrarily large for the following reasons:
1. Large coupling can delocalize the lower laser level (so-called bound-to-continuum or continuum-to-continuum active region designs), broadening gain spectrum and lowering peak gain. Lower peak gain entails increase in threshold current density, which is very undesirable for broad-area devices.
2. Large coupling can also reduce energy spacing $E_{54}$, which increases parasitic carrier injection into the lower laser level, leading to a higher transparency current density and lower slope efficiency.

The new QCL design principles that were developed in this disclosure and described below may provide an approach to all the potential problems listed above. Specifically, laser core layers thicknesses and compositions are carefully adjusted to achieve one or more the following design characteristics in a single structure:
1. Increased active region/injector coupling: squared wave functions for all active region energy levels located below the lower laser level have >10% overlap with the injector region (reduced carrier buildup in the active region)
2. Vertical laser transition: distance between average coordinates for the upper and lower laser level<10 nm
3. $E_{54}$>60 meV (suppressed carrier injections into states other than the upper laser level)
4. Active region depth $E_{32}$>100 meV (further reduces carrier backscattering)

The disclosed design provides a larger active region depth and/or active region/injector coupling than either single-phonon, double-phonon, or non-resonant extraction designs and, in contrast to the bound-to-continuum design, it is based on a vertical laser transition. Therefore, it is substantially different from all the main QCL designs reported in literature.

Figure 4:
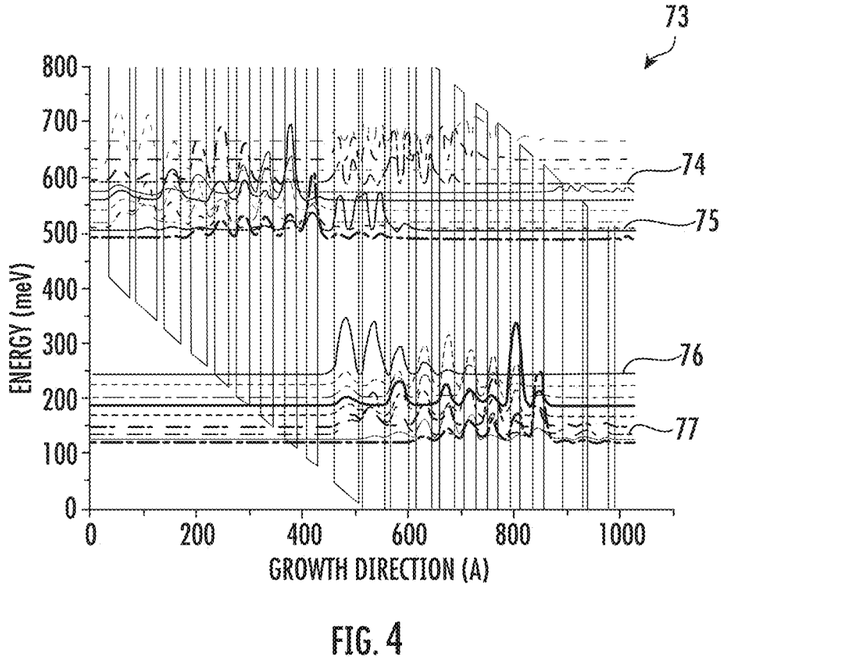
FIG. 4 is a band diagram of an optimized structure: large active region/injector coupling, vertical transition, $E_{54}$~80 meV, and $E_{32}$>100 meV, according to the present disclosure.

All these design characteristics are combined in an exemplary laser design presented in FIG. 4. For that design, the above mentioned parameters had the following values:
1. Active region/injector coupling: squared wave functions for all active region energy levels located below the lower laser level have >15% overlap with the injector region
2. Vertical laser transition: distance between average coordinates for the upper and lower laser level<50 nm
3. $E_{54}$~80 meV
4. Active region depth $E_{32}$>110 meV in a broad bias range (80 to 100 kV/cm)

The design is projected to have a high performance in the broad-area configuration. The design will also likely outperform other active region designs such single-phonon, double-phonon, bound-to-continuum, and non-resonant-extraction designs in the traditional narrow ridge configuration.

Beam Quality Control

Figure 5:
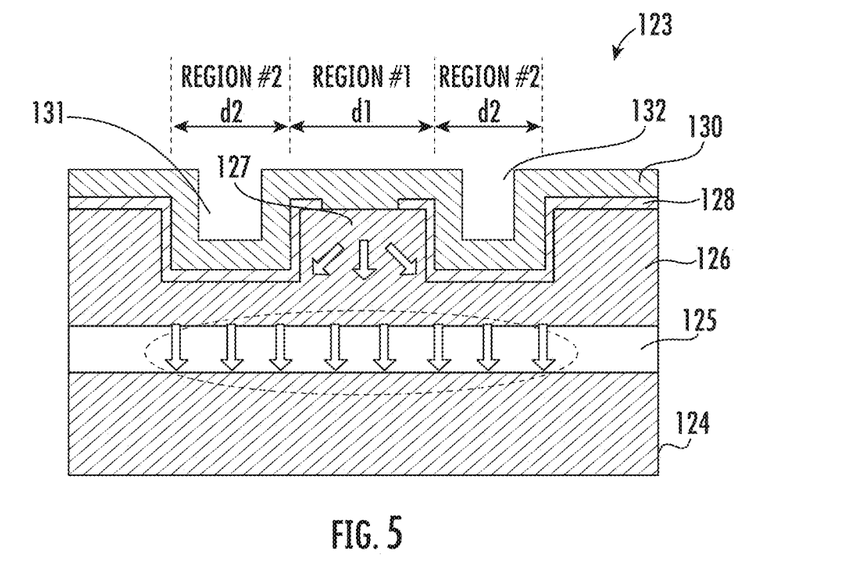
FIG. 5 is a schematic diagram of a double-channel shallow ridge-waveguide configuration, according to the present disclosure.

Discrimination against high-order modes is one of the technical challenges in broad-area QCL design. Possible approaches include tilted-cavity waveguide geometry [5], employment of FIB-defined high order mode discriminating features into the waveguide [6], and other methods. The simplest and most practical solution addressed here is the shallow-ridge waveguide (SRW) configuration [7, 8], where etching of the ridge is stopped before reaching the laser core (FIG. 5). Different sequence of layers in regions #1 and #2 above the laser core creates a lateral contrast in effective refractive index and a contrast in waveguide losses. Both can be used for mode control by carefully choosing etching depth and values for d1 and d2. In addition, current spreading, and therefore, gain-guiding, can also be controlled by carefully choosing etching depth. This approach is very cost effective and compatible with a high throughput production.

The SRW configurations was explored in Refs. 7 and 8 only in pulsed mode and no SRW design principles for CW operation were outlined in those reports. In addition, only gain-guided configuration was explored in Ref. 8 that is unlikely to be sufficient to ensure an efficient high-order mode suppression in CW mode: laser core self-heating in CW mode reaches its highest value at the center of the laser core, which favors higher order modes. Therefore, a large mode discrimination in terms of losses/gain and mode overlap factor has to be applied to achieve a high quality beam.

Figure 6:
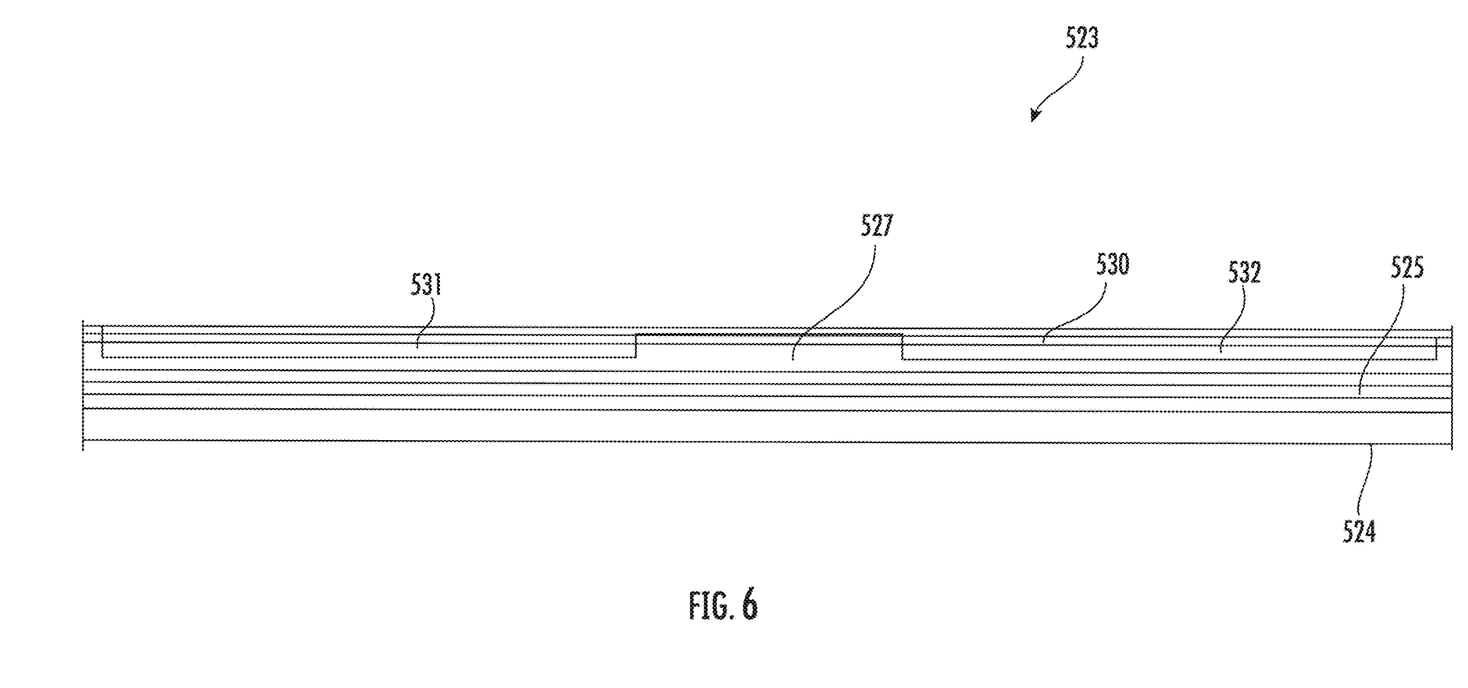
FIG. 6 is a schematic diagram of a double channel shallow ridge waveguide, according to the present disclosure.

The present disclosure provides a numerical analysis for the optimal design of the SRW described below. The shallow ridge configuration uses etching features that leaves the slab laser core intact, as shown in FIG. 6. A COMSOL model incorporating current flow, joule heating, and waveguide modes was built to study the effects of channel configuration on a modified waveguide of an exemplary structure S2 that emitted at 5.7 µm [9]. The waveguide used S2 as a base design, reducing the epi-side InP:Si 1E17 $cm^{-3}$ layer to 3 µm, and adding a 300 nm substrate side and 250 nm epi-side InGaAs:Si 4E17 $cm^{-3}$ layer around the laser core in a separate confinement heterostructure configuration.

To simulate the effects of current spreading on gain, and thus gain guided modes, assumptions were made about the temperature behavior of the device. Threshold is treated with a 140 K characteristic temperature [9]:

$$J_{th} = \left(J_{tr} + \frac{\alpha_{wg} + \alpha_m}{\Gamma g}\right)e^{\frac{T-T_R}{T_0}}$$

Transparency current is taken to have the same behavior with characteristic temperature $T_0$, forcing differential gain having an inverse relationship:

$$J_{tr}(T) = J_{tr}(T_R)e^{\frac{T-T_R}{T_0}}$$
$$g(T) = g(T_R)e^{-\frac{T-T_R}{T_0}}$$

This gives form for gain (and imaginary index) in the laser core:

$$\text{gain} = g(T_R)\left(J_y e^{\frac{T-T_R}{T_0}} - J_{tr}(T_R)\right) = \frac{4\pi}{\lambda_0}n''$$

Taking this as the temperature and (growth direction) current dependent form of gain in the laser core, the simulation is run in two steps. The first finds steady state current and temperature distribution assuming that the epi-side is kept at 293 K and 0 V, with a positive voltage applied to the substrate side.

Current spreads beyond the width of the shallow ridge as it reaches the laser core. Temperature buildup occurs nearly entirely in the laser core. Temperature spreads through the substrate around the area of high current density (high heat generation) and reaches the heat sink.

The current distribution on the epitaxial side of the laser core features spikes in density just below the walls of the central ridge, creating "ears". Overall gain begins to degrade before the "ears" exceed rollover due to device heating, so local spikes in current density should not be a concern. The substrate side shows a more Gaussian behavior, with current spreading causing a wider and lower distribution. Gain is then stronger in the epi-side direction. Full width at half maximum (FWHM) of the current spreading for the 30 µm ridge is >50 µm.

Figure 7:
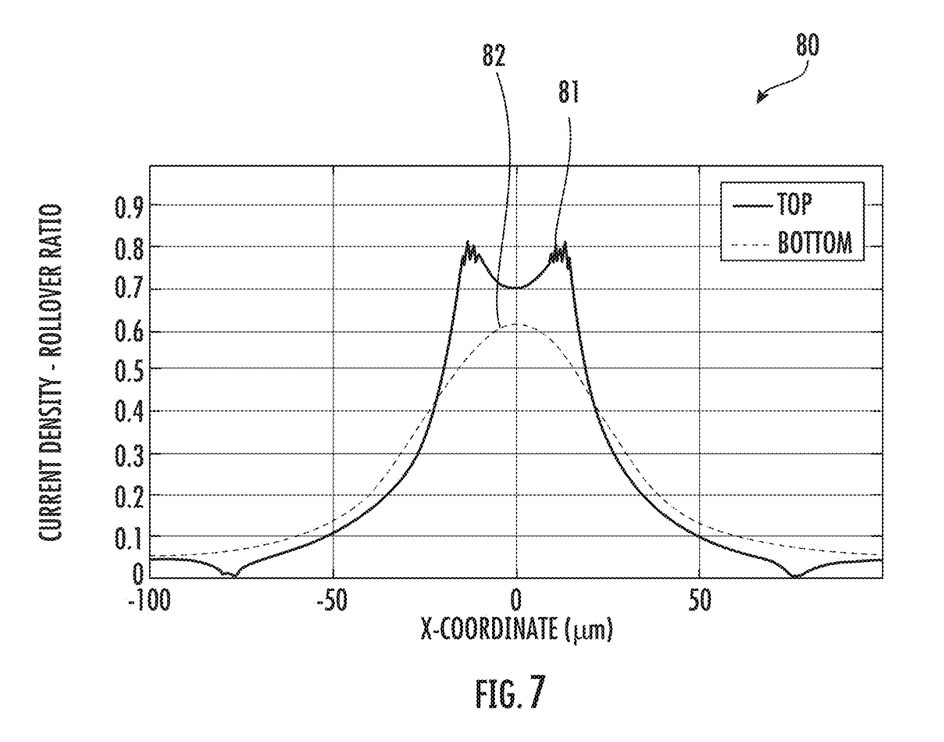
FIG. 7 is a diagram of a current density ratio with rollover current density, according to the present disclosure.

FIG. 7 shows a diagram 80 of a current density ratio with rollover current density at a 7 V bias for a 30 µm ridge and 60 µm channels etched 2.7 µm deep. Curve 81 indicates epi-side (top) current density along the edge of the laser core, and curve 82 indicates substrate side (bottom) current density.

Figure 8:
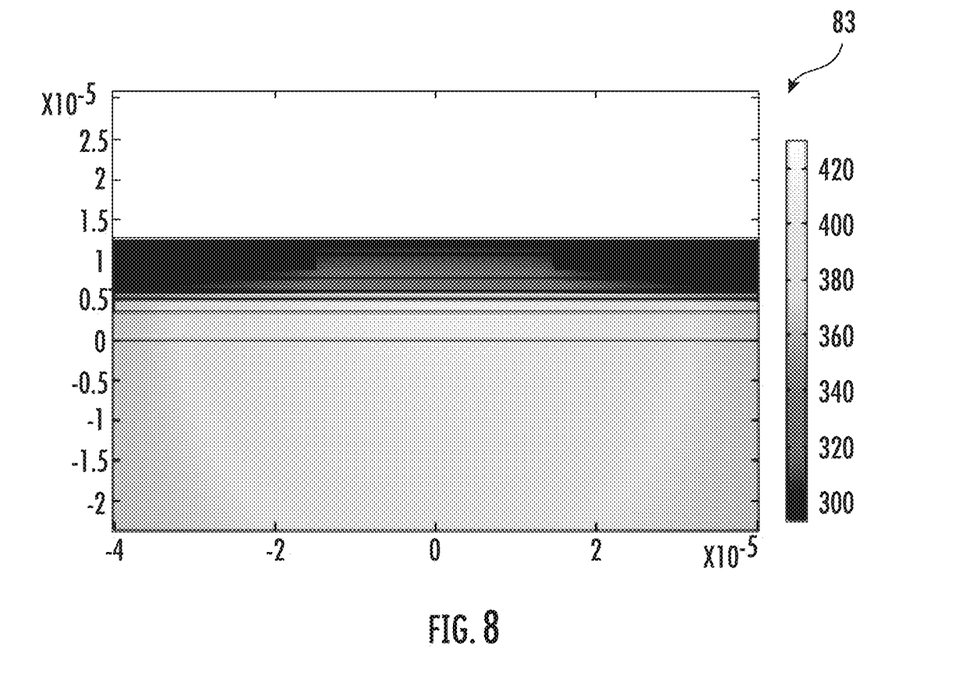
FIG. 8 is a diagram of temperature spread near laser core, according to the present disclosure.
Figure 9:
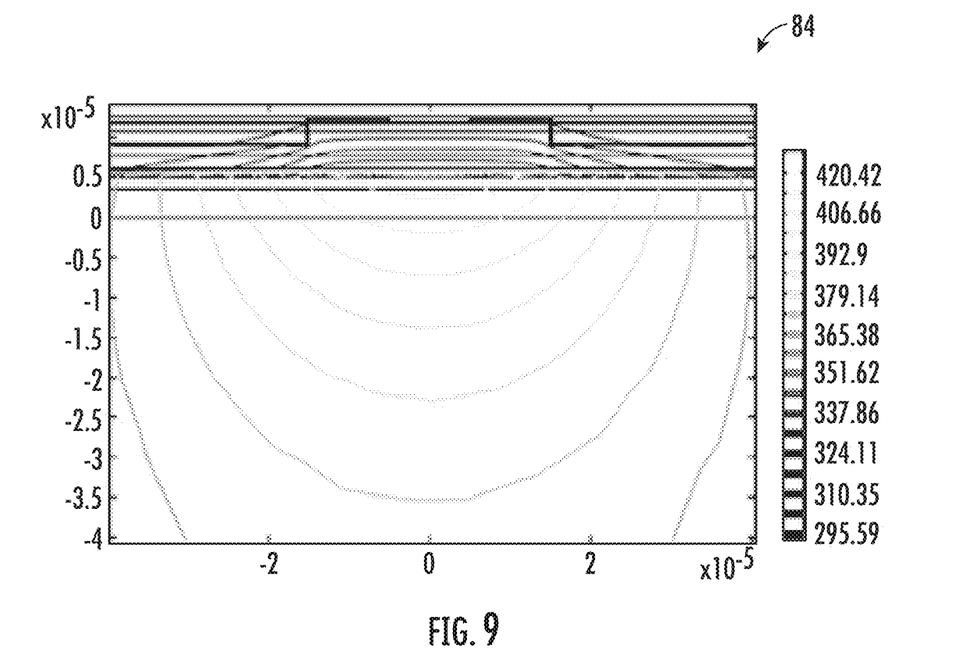
FIG. 9 is a diagram of isothermal curves showing data identical to FIG. 7.

Temperature build up in the device (diagrams 83, 84 of FIGS. 8 {7 V bias, 30 µm ridge, 60 µm wide by 2.7 µm deep channels} and 9) causes performance degradation past 7 V bias in the S2 laser core. The temperature distribution at increasing bias gives a gain distribution that allows the secondary transverse mode to become more competitive in terms of modal gain. The placement of the channels allows for greater waveguide absorption in the higher order modes, as the increased proximity to SiN and Au gives enhanced losses.

Figure 10:
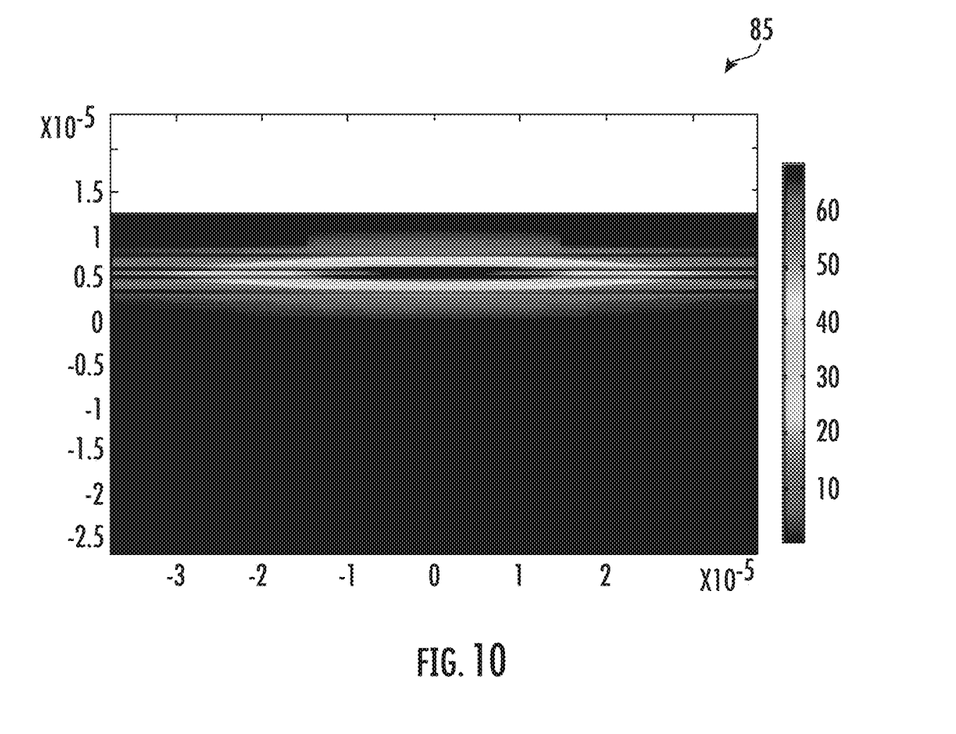
FIG. 10 is a diagram of a first order transverse mode electric field magnitude, according to the present disclosure.
Figure 11:
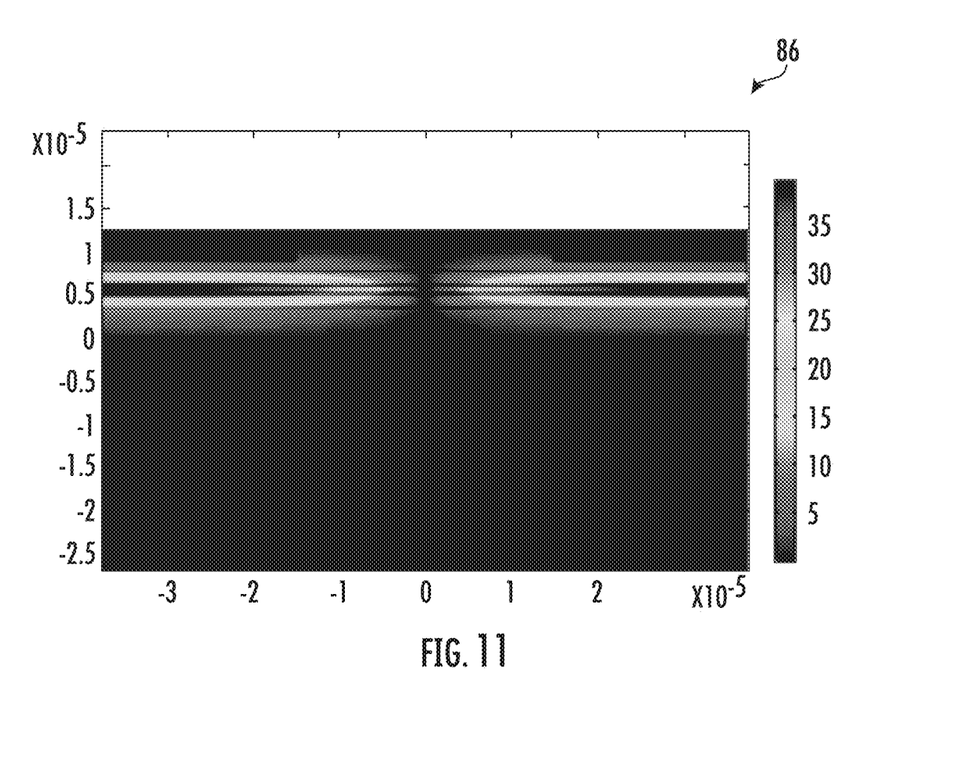
FIG. 11 is a diagram of a second order transverse mode electric field magnitude, according to the present disclosure.

FIGS. 10 and 11 include diagrams 85, 86 respectively showing first order and second order transverse mode electric field magnitude. The central ridge width can be used to tailor maximum gain for the fundamental mode. Wider central ridges are more accommodating to higher order modes, and may allow lasing of the second order mode at high bias. Too narrow a ridge will concentrate the current density into too small a region relative to fundamental mode size, and will also lead to greater local heating, reducing performance.

The depth of the channel provides vertical confinement. In general, deeper channels lead to greater mode confinement in the laser core, and thus, more modal gain. There is a "squeezing" effect for higher order modes, allowing them to spread laterally with deep enough channels, pushing them toward the high gain central region. Channel depth should be chosen (after central ridge width) to allow just enough gain to not exceed mirror losses for higher order modes to allow for maximum fundamental mode net gain.

The overall width of the channels was constructed to allow for an overall width of 150 µm for central ridge and channels combined. Wide channels are necessary to provide as much loss as possible for higher order modes. This width left 100 µm of un-etched material on each side for structural support during epi-down mounting. The optimal design for maximum gain with no net gain for higher order modes was a 30 µm ridge with 60 µm wide by 2.7 µm deep etched channels in a 10 mm long device.

The structure reported in Ref. 7 was the only shallow-ridge RWG QCL structure explored so-far. It had 50 µm-wide channels. Channel width<50 µm is typically used for QCLs. The present disclosure provides that it is advantageous to use >50 µm wide channels to ensure higher order mode suppression in high duty cycle operation and only narrow ridges without metal contact openings at the edges of the chip are sufficient for structural support in the epi-down configuration required for CW operation.

Current spreading and mode losses are controlled with choosing proper etching depth in the proposed configuration. Mode losses can be independently controlled in the modified "two-level etch" configuration presented in FIG. 12. When width of the lower ridge is less than FWHM of current spreading, current uniformly pumps the active region. At the same time, depth of the first etch controls higher mode losses. This configuration has not been explored so far for CW QCLs.

Figure 13:
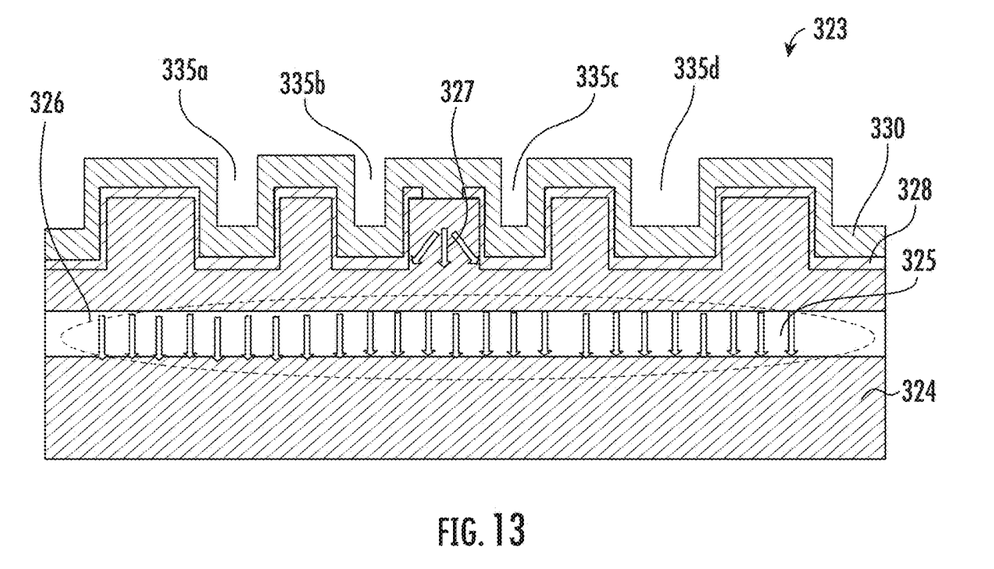
FIG. 13 is a schematic diagram of a multi-channel shallow ridge-waveguide configuration, according to the present disclosure.

The traditional double-channel SRW can also be extended to a multiple-channel (>2 channels) design shown in FIG. 13. In the multi-channel SRW configuration, exact position for each ridge and channel, as well as etching depth are chosen to suppress high order mode operation while insuring that overall efficiency is not sacrificed.

Facet Damage Control and Packaging

As mentioned above, high power CW operation leads to QCL output facet damage. The problem is exacerbated (damage threshold reduces) when HR-coating is applied to the back facet and AR-coating is applied to the front facet of the laser due to a residual absorption in the coating materials. To maximize optical power from a single emitter (especially in the broad-area configuration with a very high output power level), the present disclosure provides a concept of a new packaging for a single QCL emitter that can be used both for traditional QCLs and for the broad-area devices.

A QCL chip in this configuration is used without any coating material applied to either facet or with coating material that has a high damage threshold. The basic idea of the new design is to independently collect optical power emitted from the two laser facets and then recombine the two beams using one of many possible beam combining approaches, such as the spatial beam combining (placing the two beam close to each other), polarization beam combining, etc.

Figure 14:
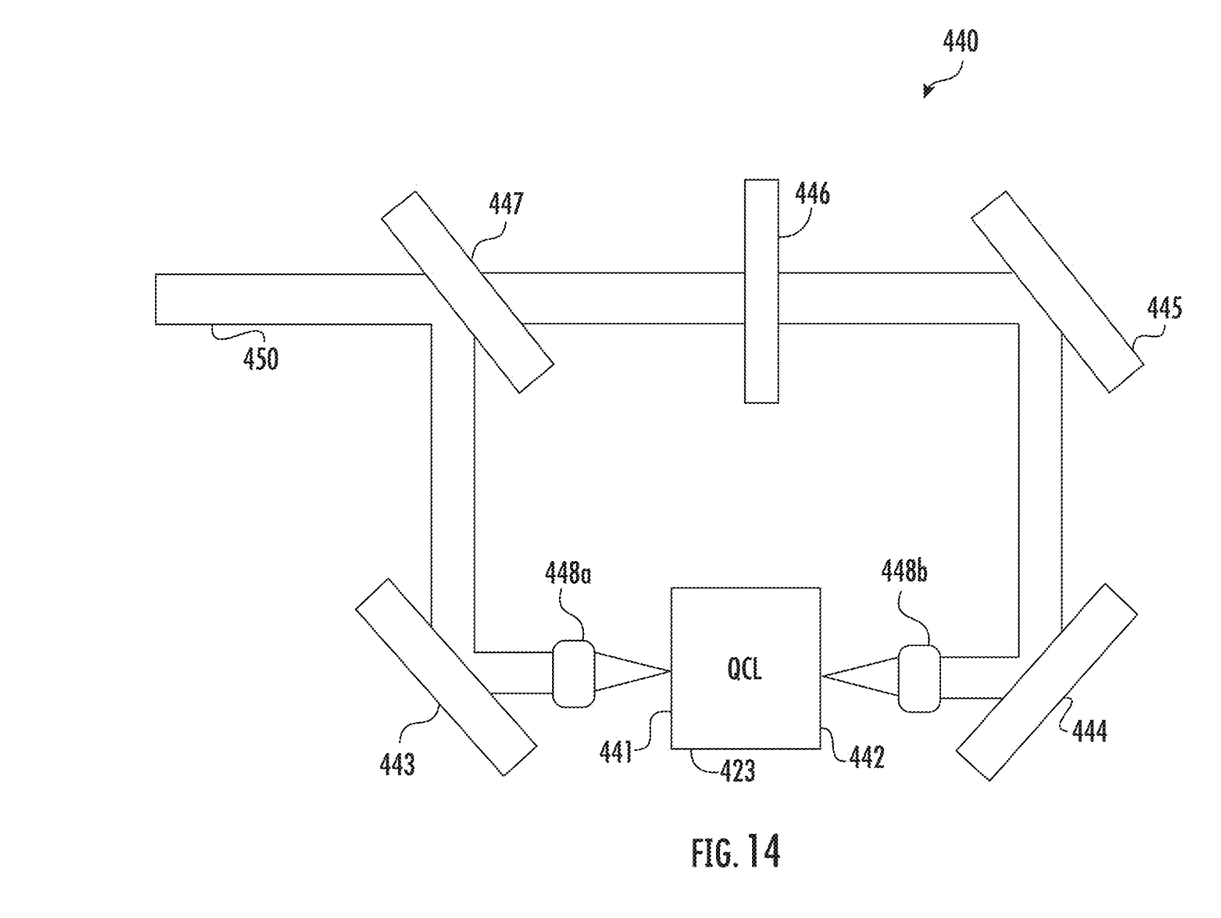
FIG. 14 is a schematic diagram of a QCL system, according to the present disclosure.

FIG. 14 illustrates a high power module utilizing polarization beam combining. After the propagation direction of the optical beam emitted from the right facet of the laser is changed by 180° (two mirror reflections), polarization for the beam is rotated by 90° using a half-wave plate, followed by polarization beam combining with the beam emitted from the front laser facet using a polarizer. Beam combining for this approach has the advantage of low losses: 1-3% for each of the optical elements in the setup. An estimated module size for this configuration is 2"×2"×1.5", resulting into an unprecedented combination of size, weight, and power for a MWIR emitters. This configuration can be extended to multiple emitters.

Specifically, beam from several uncoated chips lasing at different wavelengths can be combined into a single high brightness beam using polarization beam combining.

Referring now additionally to FIGS. 3A-5, another embodiment of the QCL 123 is now described. In this embodiment of the QCL 123, those elements already discussed above with respect to FIG. 1B are incremented by 100 and most require no further discussion herein. This embodiment differs from the previous embodiment in that this QCL 123 illustratively includes a substrate 124, and a sequence of semiconductor epitaxial layers adjacent the substrate and defining an active region 125, an injector region 127 adjacent the active region, and a waveguide 126 optically coupled to the active region. The active region 125 illustratively includes a plurality of stages, each stage having an upper laser level and a lower laser level defining respective first and second wave functions 63-66, 68, 70-72, 74-77 (diagrams 62, 67 & 73). The upper laser level has an upper laser level average coordinate, and the lower laser level has a lower laser level average coordinate. The upper laser level average coordinate and the lower laser level average coordinate have spacing therebetween of less than 10 nm. Wave functions for all active region energy levels located below the lower laser level have greater than 10% overlap with the injector region. Energy spacing between uppermost laser levels exceeds 60 meV. A depth of the active region is greater than 100 meV.

Moreover, the QCL 123 illustratively includes an insulator layer 128 over the sequence of semiconductor epitaxial layers, and an electrically conductive layer 130 over the insulator layer. Additionally, the upper laser level average coordinate and the lower laser level average coordinate are derived based upon $\int x \psi^2 dx$.

In illustrated embodiment, the waveguide 126 and the active region 125 define a double-channel shallow-ridge configuration with channel width exceeding 50 μm and a ridge width exceeding 20 μm. The active region 125 has a width exceeding 20 μm. Also, the QCL 123 defines two channels 131, 132 abutting opposing longitudinal sides of the ridge.

Figure 12:
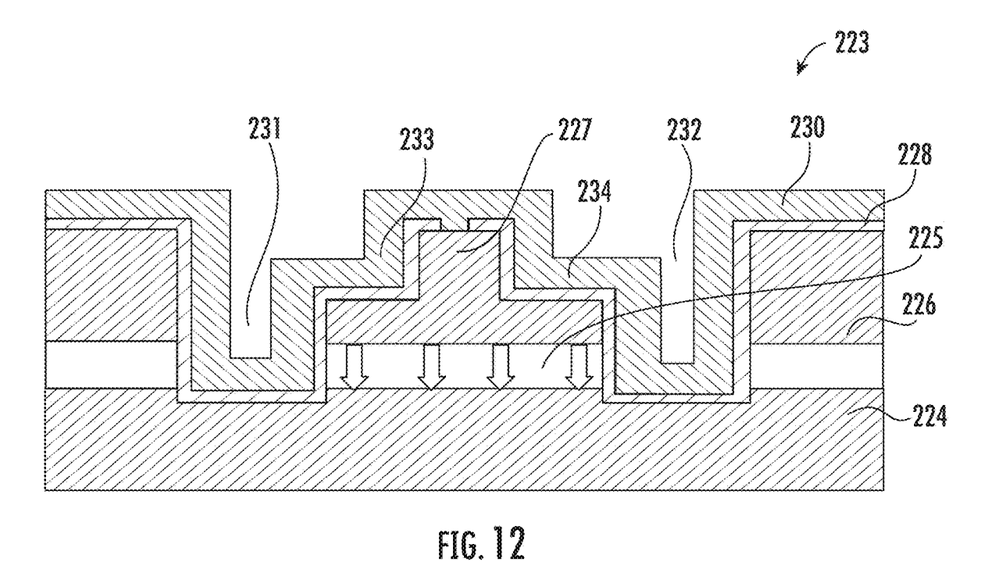
FIG. 12 is a schematic diagram of a two-level etch ridge-waveguide configuration, according to the present disclosure.

Referring now additionally to FIG. 12, another embodiment of the QCL 223 is now described. In this embodiment of the QCL 223, those elements already discussed above with respect to FIGS. 3A-5 are incremented by 200 and most require no further discussion herein. This embodiment differs from the previous embodiment in that this QCL 223 illustratively includes the waveguide 226 and the active region 225 defining a two-level ridge configuration. The QCL 223 illustratively includes a first level ridge 231, 232 extending into the active region 225. Also, the QCL 223 illustratively includes a second level ridge 233, 234 extending to a depth less than that of the first level ridge 231, 232.

Referring now additionally to FIG. 13, another embodiment of the QCL 323 is now described. In this embodiment of the QCL 323, those elements already discussed above with respect to FIGS. 3A-5, 12 are incremented by 300 and most require no further discussion herein. This embodiment differs from the previous embodiment in that this QCL 323 illustratively includes the waveguide 326 and the active region 325 defining a multi-channel configuration with four channels 335a-335d.

Referring now additionally to FIG. 14, a QCL system 440 including another embodiment of the QCL 423 is now described. In this embodiment of the QCL 423, those elements already discussed above with respect to FIGS. 3A-5, 12-13 are incremented by 400 and most require no further discussion herein. The QCL system 440 illustratively includes a QCL 423 as described in the embodiments (QCLs 123, 223, 323, 523) disclosed herein. The waveguide defines first and second opposing facets 441, 442, each facet configured to emit a laser output.

The QCL 423 system further comprise a plurality of optical elements 443-448b configured to combine the first and second laser outputs into a combine laser output 450. The plurality of optical elements 443-448b comprises first and second collimating lenses 448-448b configured to collimate laser outputs respectively from the first and second opposing facets 441, 442. The plurality of optical elements 443-448b comprises first, second, and third mirrors 443-445 configured to direct the first and second laser outputs, a half-wave plate 446 receiving the second laser output, and a polarizer 447 configured to reflect the first laser output and pass the second laser output.

Yet another aspect is directed to a method of making a QCL 123. The method includes forming a sequence of semiconductor epitaxial layers adjacent a substrate 124 and defining an active region 125, an injector region 127 adjacent the active region, and a waveguide 126 optically coupled to the active region. The active region 125 includes a plurality of stages, each stage having an upper laser level and a lower laser level defining respective first and second wave functions 63-66, 68, 70-72, 74-77 (diagrams 62, 67 & 73). The upper laser level has an upper laser level average coordinate, and the lower laser level has a lower laser level average coordinate. The upper laser level average coordinate and the lower laser level average coordinate have spacing therebetween of less than 10 nm. Wave functions for all active region energy levels located below the lower laser level have greater than 10% overlap with the injector region. Energy spacing between uppermost laser levels exceeds 60 meV. A depth of the active region is greater than 100 meV.

Referring now additionally to FIG. 6, another embodiment of the QCL 523 is now described. In this embodiment of the QCL 523, those elements already discussed above with respect to FIGS. 3A-5, 12-13 are incremented by 500 and most require no further discussion herein. This embodiment differs from the previous embodiment in that this QCL 523 illustratively includes the electrically conductive layer 530 fills the first and second channels 531, 532. Also, in this illustration of a double-channel shallow-ridge configuration, the sequence of semiconductor epitaxial layers is indicated.

REFERENCES

Contents of Each Reference are Hereby
Incorporated by Reference in their Entirety

[1] A. Lyakh, R. Maulini, A. Tsekoun, R. Go, and C. K. N. Patel, Optics Express 20, 4382 (2012)
[2] Y. Bai, N. Bandyopadhyay, S. Tsao, S. Slivken, and M. Razeghi, Applied Physics Letters 98, 181102 (2011)
[3] M. Semtsiv and W. Masselink, Applied Physics Letters 109. 203502 (2016)
[4] M. Suttinger, R. Go, P. Figueiredo, A. Todi, H. Shu, J. Leshin, and A. Lyakh, Optical Engineering 57, 011011 (2017)
[5] Y. Bai, S. Slivken, Q. Lu, N. Bandyopadhay, and Razeghi, Applied Physcis Letters 101, 081106 (2012)
[6] R. Kaspi, S. Luong, C. Yang, C. Lu, T. Newell, and T. Bate, Applied Physics Letters 109, 211102 (2016)
[7] A. Lyakh, P. Zory, D. Wasserman, G. Shu, C. Gmachl, M. D'Souza, D. Botez, and D. Bour, Applied Physics Letters 90, 141107 (2007)
[8] I. Sergachev, R. Maulini, A. Bismuto, S. Blaser, T. Gresch, and A. Muller, Optics Express 24, 19063 (2016)
[9] Matthew M Suttinger, Rowel Go, Pedro Figueiredo, Ankesh Todi, Hong Shu, Jason Leshin, and Arkadiy Lyakh, Optical Engineering 57, 011011 (2017)

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

The invention claimed is:
1. An optical system comprising:
a quantum cascade laser (QCL) comprising
a substrate, and
a sequence of semiconductor epitaxial layers adjacent the substrate and defining an active region, and a waveguide optically coupled to the active region,
the active region comprising a plurality of stages, the waveguide defining first and second opposing facets configured to respectively emit first and second laser outputs, the waveguide and the active region defining a double-channel shallow-ridge configuration with channel width exceeding 50 μm and a ridge width exceeding 20 μm, each channel from the double-channel shallow-ridge configuration being vertically spaced apart from the active region, the sequence of semiconductor epitaxial layers being different in a region D1 over an injector region and a second region D2 over each channel to create a lateral contrast in effective refractive index and a contrast in waveguide losses; and
first and second collimating lens configured to respectively receive the first and second laser outputs; and
a plurality of mirrors configured to combine the first and second laser outputs.
2. The optical system according to claim 1 further comprising a wave plate coupled between the plurality of mirrors.
3. The optical system according to claim 2 wherein the wave plate comprises a half-wave plate.
4. The optical system according to claim 1 further comprising a polarizer configured to receive the combined first and second laser outputs.
5. The optical system according to claim 4 wherein the polarizer is configured to reflect the first laser output and pass the second laser output.
6. The optical system according to claim 1 wherein the QCL further comprises an insulator layer over the sequence of semiconductor epitaxial layers, and an electrically conductive layer over the insulator layer.
7. The optical system according to claim 1 wherein the plurality of mirrors comprises first, second, and third mirrors each coupled at an acute angle with the first and second opposing facets.
8. An optical system comprising:
a quantum cascade laser (QCL) comprising
a substrate, and
a sequence of semiconductor epitaxial layers adjacent the substrate and defining an active region, and a waveguide optically coupled to the active region,
the active region comprising a plurality of stages, the waveguide defining first and second opposing facets configured to respectively emit first and second laser outputs, the waveguide and the active region defining a double-channel shallow-ridge configuration with channel width exceeding 50 μm and a ridge width exceeding 20 μm, each channel from the double-channel shallow-ridge configuration being vertically spaced apart from the active region, the sequence of semiconductor epitaxial layers being different in a region D1 over an injector region and a second region D2 over each channel to create a lateral contrast in effective refractive index and a contrast in waveguide losses; and
first and second collimating lens configured to respectively receive the first and second laser outputs;
a plurality of mirrors configured to combine the first and second laser outputs;
a wave plate coupled between the plurality of mirrors; and
a polarizer configured to receive the combined first and second laser outputs.
9. The optical system according to claim 8 wherein the wave plate comprises a half-wave plate.
10. The optical system according to claim 8 wherein the polarizer is configured to reflect the first laser output and pass the second laser output.
11. The optical system according to claim 8 wherein the QCL further comprises an insulator layer over the sequence of semiconductor epitaxial layers, and an electrically conductive layer over the insulator layer.
12. A method for making an optical system comprising:
forming a quantum cascade laser (QCL) comprising
a substrate, and
a sequence of semiconductor epitaxial layers adjacent the substrate and defining an active region, and a waveguide optically coupled to the active region,
the active region comprising a plurality of stages, the waveguide defining first and second opposing facets configured to respectively emit first and second laser outputs, the waveguide and the active region defining a double-channel shallow-ridge configuration with channel width exceeding 50 μm and a ridge width exceeding 20 μm, each channel from the double-channel shallow-ridge configuration being vertically spaced apart from the active region, the sequence of semiconductor epitaxial layers being different in a region D1 over an injector region and a second region D2 over each channel to create a lateral contrast in effective refractive index and a contrast in waveguide losses; and coupling first and second collimating lens to respectively receive the first and second laser outputs; and coupling a plurality of mirrors to combine the first and second laser outputs.

13. The method according to claim 12 further comprising coupling a wave plate between the plurality of mirrors.

14. The method according to claim 13 wherein the wave plate comprises a half-wave plate.

15. The method according to claim 12 further comprising coupling a polarizer to receive the combined first and second laser outputs.

16. The method according to claim 15 wherein the polarizer is configured to reflect the first laser output and pass the second laser output.

17. The method according to claim 12 further comprising coupling each of first, second, and third mirrors at an acute angle with the first and second opposing facets.

18. The optical system according to claim 8 wherein the plurality of mirrors comprises first, second, and third mirrors each coupled at an acute angle with the first and second opposing facets.

* * * * *